(12) United States Patent
Onishi et al.

(10) Patent No.: US 6,671,301 B1
(45) Date of Patent: Dec. 30, 2003

(54) SEMICONDUCTOR DEVICE AND METHOD FOR PRODUCING THE SAME

(75) Inventors: Toshikazu Onishi, Kyoto (JP); Hideto Adachi, Osaka (JP); Masaya Mannou, Nara (JP); Akira Takamori, Osaka (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/565,937

(22) Filed: May 5, 2000

(30) Foreign Application Priority Data

May 7, 1999 (JP) .......................... 11-127779

(51) Int. Cl.[7] .................................. H01S 5/00
(52) U.S. Cl. .......................... 372/46; 372/45
(58) Field of Search ..................... 372/45–46

(56) References Cited

U.S. PATENT DOCUMENTS

| 5,108,948 A | | 4/1992 | Murakami et al. | |
|---|---|---|---|---|
| 5,151,913 A | * | 9/1992 | Ueno | 372/46 |
| 5,469,457 A | * | 11/1995 | Nagai et al. | 372/45 |
| 5,574,741 A | | 11/1996 | Arimoto | |
| 5,757,835 A | * | 5/1998 | Ono et al. | 372/46 |
| 5,987,047 A | * | 11/1999 | Valster et al. | 372/45 |

FOREIGN PATENT DOCUMENTS

| JP | 64-014986 | 1/1989 |
|---|---|---|
| JP | 03-208388 | 9/1991 |
| JP | 04-14277 | 1/1992 |
| JP | 04-252089 | 9/1992 |
| JP | 05-145182 | 6/1993 |
| JP | 9-139550 | 5/1997 |

* cited by examiner

Primary Examiner—Paul Ip
Assistant Examiner—James Menefee
(74) Attorney, Agent, or Firm—RatnerPrestia

(57) ABSTRACT

A semiconductor laser device including: a semiconductor substrate of a first conductivity type; a cladding layer of the first conductivity type provided on the semiconductor substrate; an active layer provided on the cladding layer of the first conductivity type, the active layer having a super-lattice structure including a disordered region in a vicinity of at least one cavity end face; a first cladding layer of a second conductivity type provided on the active layer; an etching stop layer of the second conductivity type provided on the first cladding layer; and a second cladding layer of the second conductivity type provided on the etching stop layer, the second cladding layer forming a ridge structure, the ridge structure extending along a cavity length direction and having a predetermined width. A concentration of an impurity in the etching stop layer in the vicinity of the at least one cavity end face is greater than a concentration of the impurity in the interior of a cavity and equal to or smaller than about $2 \times 10^{18}$ $cm^{-3}$.

6 Claims, 6 Drawing Sheets

SEMICONDUCTOR DEVICE AND METHOD FOR PRODUCING THE SAME

BACKGROUND OF THE INVENTION

1. Field of the Invention

The present invention relates to a semiconductor laser device, and a method for producing the same. In particular, the present invention relates to a semiconductor laser device having a window structure for providing an improved production yield, and a method for producing the same.

2. Description of the Related Art

In recent years, semiconductor laser devices for use as light sources for information processing apparatuses (e.g., optical disk apparatuses) have been expected to provide higher and higher output power in order to attain higher recording speeds. One method for satisfying such needs involves the use of a window structure at an end face of a laser cavity, which improves the catastrophic optical damage (hereinafter "COD") level at the end face.

COD is an instantaneous degradation phenomenon which occurs as the optical output of a semiconductor laser is increased to or above a certain limit value. A COD phenomenon occurs in the case where the vicinity of an end face of a semiconductor laser becomes an absorption region with respect to the light which occurs within the laser.

Specifically, a COD phenomenon may occur when dangling bonds are formed due to oxygen adsorption or surface oxidation on the semiconductor surface of the end face of the laser cavity, generating a peculiar deep level on the semiconductor surface, thereby substantially narrowing the forbidden band width in the vicinity of the end face. Since any non-radiative recombination due to a surface level present on the semiconductor surface introduces an increase in temperature, the occurrence of a COD phenomenon results in further reduction of the forbidden band width in the vicinity of the end faces of the laser cavity and further increases light absorption. Thus, there is a positive feedback with respect to the COD phenomenon. As a result, the end faces may be destroyed due to melting or the like, which leads to a decrease in the optical output as well as irreversible degradation of the device.

Some semiconductor laser devices employ a window structure so as to enhance the band gap energy in a portion of an active layer near a laser cavity end face, thereby preventing COD destruction at the cavity end face. For example, a window structure can be realized by diffusing an impurity in the vicinity of a laser cavity end face so as to disorder the super-lattice structure in the active layer.

Hereinafter, a method for producing a conventional window structure semiconductor laser device will be described. FIGS. 6A to 6D are diagrams illustrating respective steps of a manufacturing process for a conventional window structure semiconductor laser device.

First, as shown in FIG. 6A, the following semiconductor multilayer structure is formed on an n-GaAs substrate 601 by using an MOVPE (metal organic vapor phase epitaxy) method, where the respective layers are sequentially grown into crystals in this order: an n-AlGaInP cladding layer 602, an AlGaInP/GaInP super-lattice active layer 603, a p-AlGaInP first cladding layer 604, a p-GaInP etching stop layer 605, a p-AlGaInP second cladding layer 606, a p-GaInP band graded layer 607, and a p-GaAs capping layer 608.

Next, as shown in FIG. 6B, by using a plasma CVD (chemical vapor deposition) technique, an SiN film 609 is formed on the aforementioned semiconductor multilayer structure. Furthermore, the SiN film 609 is patterned by dry etching so as to form two parallel openings whose planar forms appear as two stripes having a width of several dozen $\mu$m. A wet etching step removes the portions of the GaAs capping layer 608 where these openings are formed. Thereafter, a ZnO film 610 and an $SiO_2$ film 611 are formed by sputtering so as to cover the semiconductor multilayer structure (including the openings). Furthermore, an annealing is performed so as to diffuse Zn from the ZnO film 610 through the portions of the p-GaInP layer 607 which are exposed in the openings of the SiN film 609, and the openings in the GaAs capping layer 608. Through such solid-phase diffusion of Zn, impurity diffusion regions 612 having stripe-like planar forms are formed, and the portions of the AlGaInP/GaInP super-lattice active layer 603 which lie within the impurity diffusion regions 612 are converted into a mixed crystal. The regions of the active layer 603 which have been converted into the mixed crystal define window structures. The window structures have a higher band gap energy than that of the regions which have not formed a mixed crystal.

Referring to FIG. 6C, the $SiO_2$ film 611, the ZnO film 610, the SiN film 609, and the GaAs film 608 are removed. Thereafter, by using a known technique, a stripe pattern of $SiO_2$ film 613 is formed on the exposed p-GaInP band graded layer 607 so as to extend along a plane which is perpendicular to the longitudinal direction of the impurity diffusion regions 612. By using the stripe pattern of $SiO_2$ film 613 as a mask, the p-GaInP band graded layer 607 is etched into a ridge shape by using an acetic acid-type etchant. Then, switching to a sulfuric acid-type etchant, the p-AlGaInP second cladding layer 606 is etched away until reaching the p-GaInP etching stop layer 605. As a result, a ridge structure composed of the p-GaInP band graded layer 607 and the p-AlGaInP second cladding layer 606 is formed as shown in FIG. 6C. Since the sulfuric acid-type etchant has a greater etching rate for the p-AlGaInP second cladding layer 606 than for the p-GaInP etching stop layer 605, the etching process can be successfully stopped at the etching stop layer 605.

Thereafter, an n-type current blocking layer 614 is grown so as to bury the side of the ridge structure by a selective growth technique using an MOVPE method. After removing the $SiO_2$ film 613 serving as a stripe mask, a p-GaAs contact layer 615 is grown over the n-type current blocking layer 614 and the p-GaInP band graded layer 607. By using a known technique, p-side and n-side ohmic electrodes are formed (not shown).

The resultant semiconductor multilayer structure is cleaved in the impurity diffusion regions 612 along a plane perpendicular to the longitudinal direction of the ridge structure, thereby forming laser cavity end faces. As a result, a semiconductor laser device having window structures as shown in FIG. 6D is accomplished.

Conventional semiconductor laser devices with window structures are formed by the above-described manufacturing process. However, in accordance with the above-described manufacturing process, not only the active layer 603 but also the p-GaInP etching stop layer 605 are converted into a mixed crystal together with the surrounding AlGaInP layers during the step of Zn diffusion. That is, in accordance with above-described conventional manufacturing process, Zn is directly diffused from the Zn source, i.e., the ZnO film 610, into the AlGaInP layers, which have a relatively large diffusion coefficient. Therefore, it is difficult to control the impurity dose amount. As a result, as shown in FIG. 1, for example, a high concentration of impurity is diffused in the AlGaInP crystal, allowing for a rapid development of the mixed crystal. In particular, the thin etching stop layer 605 may eventually be destroyed by the etching. In that case, since the etching selection ratio of the sulfuric acid-type etchant is extremely decreased, the etching cannot be stopped by the etching stop layer 605, allowing the p-AlGaInP first cladding layer 604 and the active layer 603 to be etched. Thus, the ridge shape may not be controlled properly.

Moreover, in accordance with the above-described conventional manufacturing process, the current blocking layer 614 may be formed so as to be nearer the active layer 603 due to overetching. As a result, the angle of expanse of light exiting the active layer 603 cannot be effectively controlled. In a loss-guide type semiconductor laser device, in particular, the propagation loss is increased so that the laser characteristics of the device are greatly deteriorated, resulting in, e.g., a decrease in the output power, or an increase in the operation current.

Furthermore, in accordance with the above-described conventional manufacturing process, the impurity concentration in the active layer 603 becomes very high as shown in FIG. 1. As a result, the propagation loss due to carrier scattering is increased so that the laser characteristics of the device are greatly deteriorated, resulting in, e.g., a decrease in the output power, or an increase in the operation current.

As a method for avoiding overetching, for example, Japanese Laid-Open Publication No. 9-139550 discloses a method which involves first exposing the AlGaInP layer 606 by removing the p-GaInP layer 607 while leaving portions of the p-GaInP layer 607 only in regions where Zn has been diffused, and then performing an etching with a sulfuric acid-type etchant. According to this method, at the point in time where the etching has reached the etching stop layer 605 in regions other than the Zn diffusion regions, the AlGaInP layer 606 is left in the Zn diffusion regions due to the low etching rate for the p-GaInP band graded layer 607, and the etching is terminated at this point.

However, it is evidently difficult to accurately control the etching amount for the AlGaInP layer 606. The remainder of the AlGaInP layer 606 after etching varies per every etching.

Therefore, the height of the ridge which is formed as a result of the etching may vary, thus making it difficult to control the ridge shape.

SUMMARY OF THE INVENTION

A semiconductor laser device according to the present invention includes: a semiconductor substrate of a first conductivity type; a cladding layer of the first conductivity type provided on the semiconductor substrate; an active layer provided on the cladding layer of the first conductivity type, the active layer having a super-lattice structure including a disordered region in a vicinity of at least one cavity end face; a first cladding layer of a second conductivity type provided on the active layer; an etching stop layer of the second conductivity type provided on the first cladding layer; and a second cladding layer of the second conductivity type provided on the etching stop layer, the second cladding layer forming a ridge structure, the ridge structure extending along a cavity length direction and having a predetermined width, wherein a concentration of an impurity in the etching stop layer in the vicinity of the at least one cavity end face is greater than a concentration of the impurity in the interior of a cavity and equal to or smaller than about $2 \times 10^{18}$ cm$^{-3}$.

In one embodiment of the invention, the semiconductor substrate comprises a compound semiconductor material containing GaAs of the first conductivity type as a main component; the cladding layer of the first conductivity type comprises a compound semiconductor material containing GaP of the first conductivity type as a main component; and the active layer comprises a compound semiconductor material containing GaP as a main component, and the first cladding layer, the etching stop layer, and the second cladding layer each comprise a compound semiconductor material containing GaP of the second conductivity type as a main component.

In another embodiment of the invention, the semiconductor substrate comprises GaAs of the first conductivity type; the cladding layer of the first conductivity type comprises AlGaInP of the first conductivity type; the active layer comprises AlGaInP and GaInP: the first cladding layer comprises AlGaInP of the second conductivity type; the etching stop layer comprises GaInP of the second conductivity type; and the second cladding layer comprises AlGaInP of the second conductivity type.

In still another embodiment of the invention, a concentration gradient of the impurity in the second cladding layer in the vicinity of the at least one cavity end face, taken along a normal direction to the substrate from an upper face toward a bottom face of the substrate, is greater than a concentration gradient of the impurity in the interior of the cavity along the normal direction to the substrate, and is equal to or smaller than about $2 \times 10^{18}$ cm$^{-3}$ $\mu$m$^{-1}$.

In still another embodiment of the invention, a concentration of the impurity in the active layer in the vicinity of the at least one cavity end face is greater than a concentration of the impurity in the interior of the cavity, and is equal to or smaller than about $2 \times 10^{18}$ cm$^{-3}$.

In still another embodiment of the invention, the impurity is Zn.

In another aspect of the invention, there is provided a method for producing a semiconductor laser device including the steps of: forming a semiconductor multilayer structure on a semiconductor substrate of a first conductivity type, the semiconductor multilayer structure including: a cladding layer of the first conductivity type; an active layer having a super-lattice structure; a first cladding layer of a second conductivity type; an etching stop layer of the second conductivity type; a second cladding layer of the second conductivity type; a band graded layer of the second conductivity type; and an impurity supply control layer; disordering the active layer by diffusing an impurity at least in a predetermined region within the semiconductor multilayer structure; and patterning the second cladding layer into a ridge structure by wet etching, wherein a concentration of the impurity diffused in the etching stop layer within the predetermined region is greater than a concentration of the impurity outside the predetermined region and equal to or smaller than about $2 \times 10^{18}$ cm$^{-3}$.

In one embodiment of the invention, the semiconductor substrate comprises a compound semiconductor material containing GaAs of the first conductivity type as a main component; the cladding layer of the first conductivity type comprises a compound semiconductor material containing GaP of the first conductivity type as a main component; the active layer comprises a compound semiconductor material containing GaP as a main component; the first cladding layer, the etching stop layer, the second cladding layer, and the band graded layer each comprise a compound semiconductor material containing GaP of the second conductivity type as a main component; and the impurity supply control layer comprises a compound semiconductor material containing GaAs as a main component.

In another embodiment of the invention, the semiconductor substrate comprises GaAs of the first conductivity type; the cladding layer of the first conductivity type comprises AlGaInP of the first conductivity type; the active layer includes a super-lattice structure comprising AlGaInP and GaInP; the first cladding layer and the second cladding layer each comprise AlGaInP of the second conductivity type; the etching stop layer comprises GaInP of the second conductivity type; the band graded layer comprises GaInP of the second conductivity type; and the impurity supply control layer comprises GaAs.

In still another embodiment of the invention, the impurity supply control layer has a thickness equal to or greater than about 100 Å.

In still another embodiment of the invention, a concentration gradient of the impurity diffused in the second cladding layer within the predetermined region, taken along a normal direction to the substrate from an upper face toward a bottom face of the substrate, is greater than a concentration gradient of the impurity outside the predetermined region along the normal direction to the substrate, and is equal to or smaller than about $2 \times 10^{18}$ cm$^{-3}$ $\mu$m$^{-1}$.

In still another embodiment of the invention, a concentration of the impurity diffused in the active layer within the predetermined region is greater than a concentration of the impurity outside the predetermined region, and is equal to or smaller than about $2 \times 10^{18}$ cm$^{-3}$.

In still another embodiment of the invention, the impurity is Zn.

Thus, the invention described herein makes possible the advantages of (1) providing a semiconductor laser device having window structures which can be manufactured with a good production yield; and (2) providing a method for producing such a semiconductor laser device.

These and other advantages of the present invention will become apparent to those skilled in the art upon reading and understanding the following detailed description with reference to the accompanying figures.

DESCRIPTION OF THE PREFERRED EMBODIMENTS

Hereinafter, a method for producing a semiconductor laser device according to the present invention will be described. FIGS. 2A to 2D are diagrams illustrating respective steps of a manufacturing process for a window structure semiconductor laser device according to the present invention.

Figure 2B:
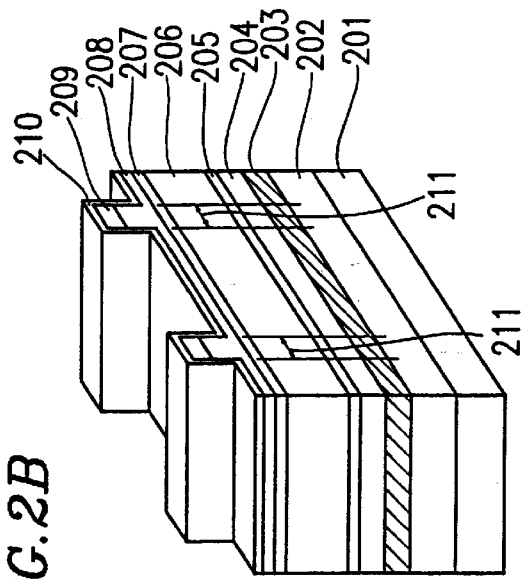
FIGS. 2A to 2D are perspective views illustrating respective steps of a manufacturing process for a window structure semiconductor laser device according to the present invention.
Figure 2D:
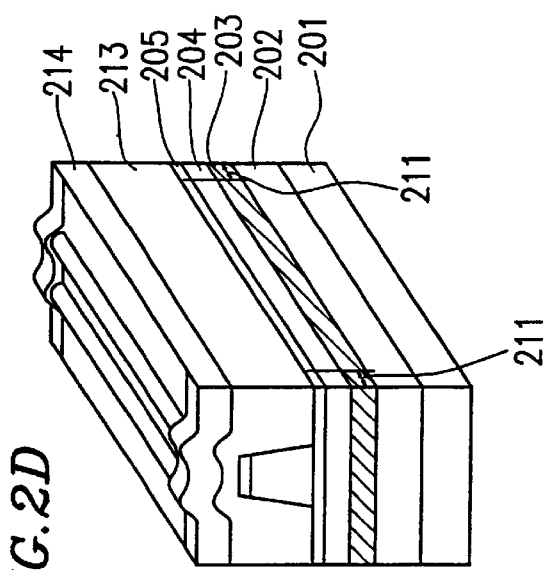
Figure 2A:
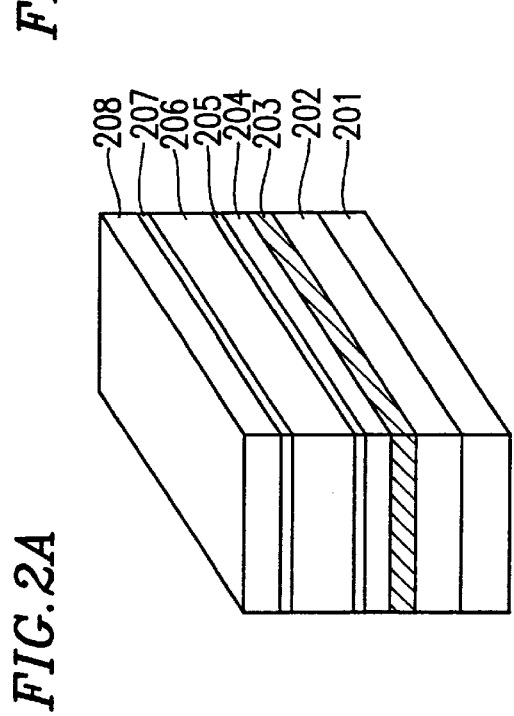

First, as shown in FIG. 2A, the following semiconductor multilayer structure is formed on an n-GaAs substrate 201 by using an MOVPE method, where the respective layers are sequentially grown into crystals in this order: an n-AlGaInP cladding layer 202, an AlGaInP/GaInP super-lattice active layer 203, a p-AlGaInP first cladding layer 204, a p-GaInP etching stop layer 205, a p-AlGaInP second cladding layer 206, a p-GaInP band graded layer 207, and a p-GaAs impurity supply control layer 208. As the crystal growth method, any other method may be used, e.g., an MBE (molecular beam epitaxy) method.

Next, as shown in FIG. 2B, a ZnO film 209 is formed on the aforementioned semiconductor multilayer structure by sputtering. After an organic resist film (not shown) is applied on the ZnO film 209, stripes having a width of several dozen $\mu$m are formed by using photolithography techniques. The portions of the ZnO film 209 and the p-GaAs impurity supply control layer 208 which lie outside the stripes are removed by wet etching. However, such portions of the p-GaAs impurity supply control layer 208 are not removed all the way down to the underlying p-GaInP band graded layer 207. Thereafter, by using a plasma CVD technique, an SiN film 210 is formed on the semiconductor multilayer structure so as to overlay the stripes. Furthermore, an annealing is performed so as to diffuse Zn from the ZnO film 209. Specifically, the Zn is solid-phase diffused in a direction from the upper face of the p-GaAs impurity supply control layer 208 toward the substrate 201, so as to reach the n-AlGaInP cladding layer 202. Through such solid-phase diffusion of Zn, stripe-like impurity diffusion regions 211 are formed so as to be parallel to each other. The impurity diffusion regions 211 will be located in the vicinity of the cavity end faces of a completed semiconductor laser device so as to function as window structures of the semiconductor laser device.

In the stripe-like impurity diffusion regions 211 which are formed through the aforementioned solid-phase diffusion of Zn, not only the crystal of the active layer 203 but also the crystal of the etching stop layer 205 are disordered. Window structures are provided through the disordering of the active layer 203. However, the disordering action also results in the decrease of the function of the etching stop layer 205. Stated otherwise, when producing window structures, it is ideal to disorder the active layer 203 while conserving the function of the etching stop layer 205. To this end, it is important to perform the solid-phase diffusion of Zn (or more generally, any impurity that is diffused) in such a manner that the concentration of Zn which is diffused into the respective layers of the semiconductor multilayer structure, in particular the n-AlGaInP cladding layer 202, the AlGaInP/GaInP super-lattice active layer 203, the p-AlGaInP first cladding layer 204, the p-GaInP etching stop layer 205, and the p-AlGaInP second cladding layer 206, is at a low level.

Hereinafter, a method according to the present invention will be described which controls the diffusion concentration of Zn (or more generally, any impurity that is diffused) within the stripe-like impurity diffusion regions 211 in the semiconductor multilayer structure.

Figure 3:
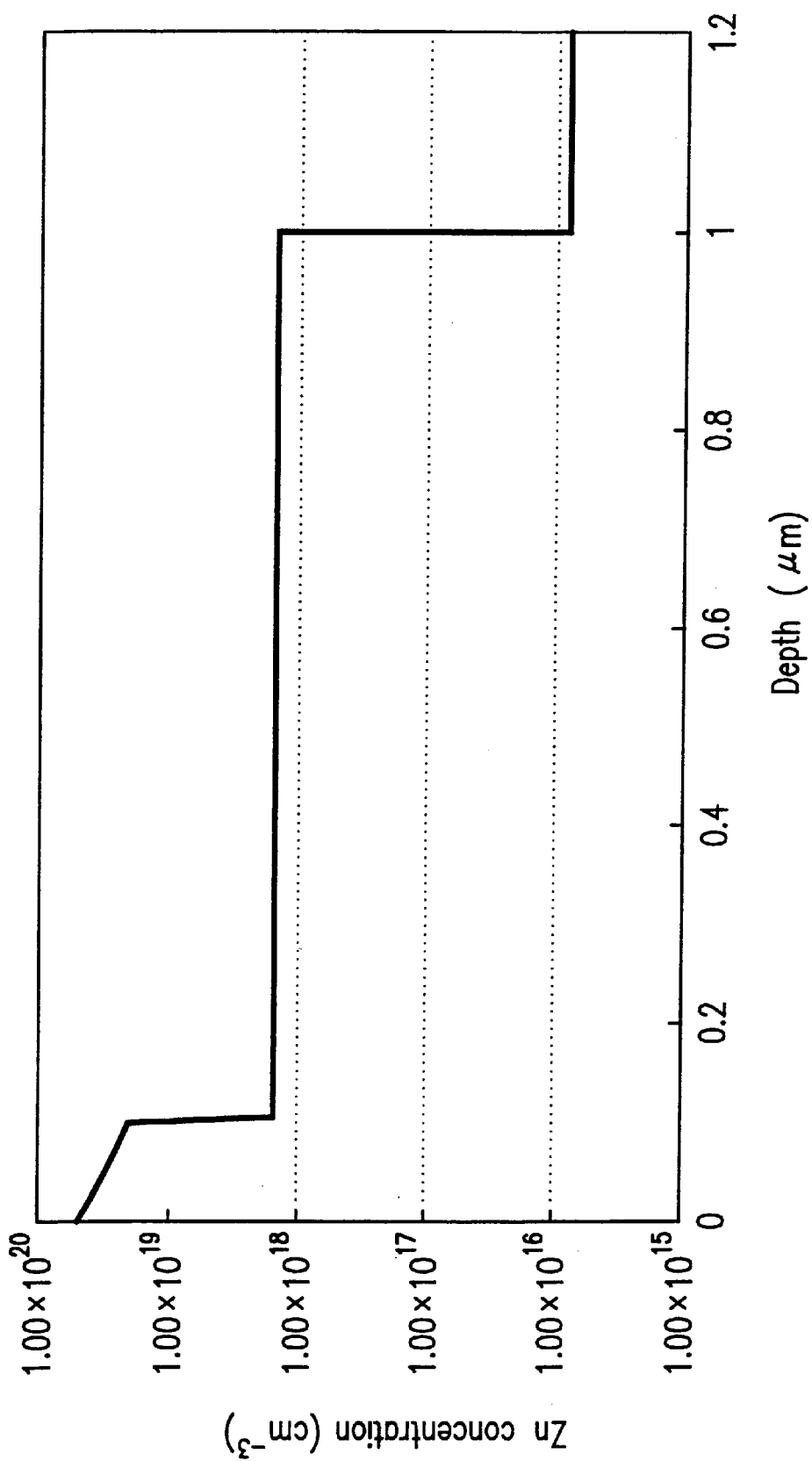
FIG. 3 is a graph obtained by measuring evaluation samples, showing a Zn diffusion profile illustrating the diffusion of Zn into GaAs during solid-phase diffusion.

FIG. 3 is a graph showing a diffusion profile of Zn, obtained by measuring evaluation samples. Specifically, each evaluation sample was obtained by forming an SiN capping layer on a ZnO film, which in turn was deposited on a GaAs layer, and the evaluation sample was heated in a nitrogen atmosphere so as to cause solid-phase diffusion of Zn. As can be seen from this graph, the diffusion behavior of Zn within the GaAs layer is such that both a low-concentration diffusion front (Zn concentration: about $2\times10^{18}$ cm$^{-3}$) having a relatively high diffusion speed and a high-concentration diffusion front (Zn concentration: about $3\times10^{19}$ cm$^{-3}$) having a relatively low diffusion speed are present. Moreover, in general, a compound semiconductor material containing P as a V group element, e.g., AlGaInP and GaInP, has a much higher Zn diffusion speed than that of a compound semiconductor material containing As as a V group element, e.g., AlGaAs and GaAs.

By taking advantage of the aforementioned diffusion behavior of Zn, the following procedure is employed according to the present invention in order to control to a low level the Zn concentration in the respective AlGaInP layers which are located between the p-GaInP band graded layer 207 and the substrate 201, i.e., the n-AlGaInP cladding layer 202, the AlGaInP/GaInP super-lattice active layer 203, the p-AlGaInP first cladding layer 204, the p-GaInP etching stop layer 205, and the p-AlGaInP second cladding layer 206, within the stripe-like impurity diffusion regions 211 in the semiconductor multilayer structure.

First, the ZnO film 209 is formed on the p-GaAs impurity supply control layer 208 in the aforementioned manner so that the p-GaAs impurity supply control layer 208 is located between the ZnO film 209 and the p-GaInP band graded layer 207. Furthermore, the diffusion conditions are prescribed so that only the low-concentration Zn diffusion front in GaAs reaches the interface between the p-GaAs impurity supply control layer 208 and the p-GaInP band graded layer 207. As a result, the Zn concentration within the stripe-like impurity diffusion regions 211 of the respective layers of the semiconductor multilayer structure which are located between the p-GaInP band graded layer 207 and the substrate 201 can be controlled to a low level (i.e., about $2\times10^{18}$ cm$^{-3}$ or less).

Figure 1:
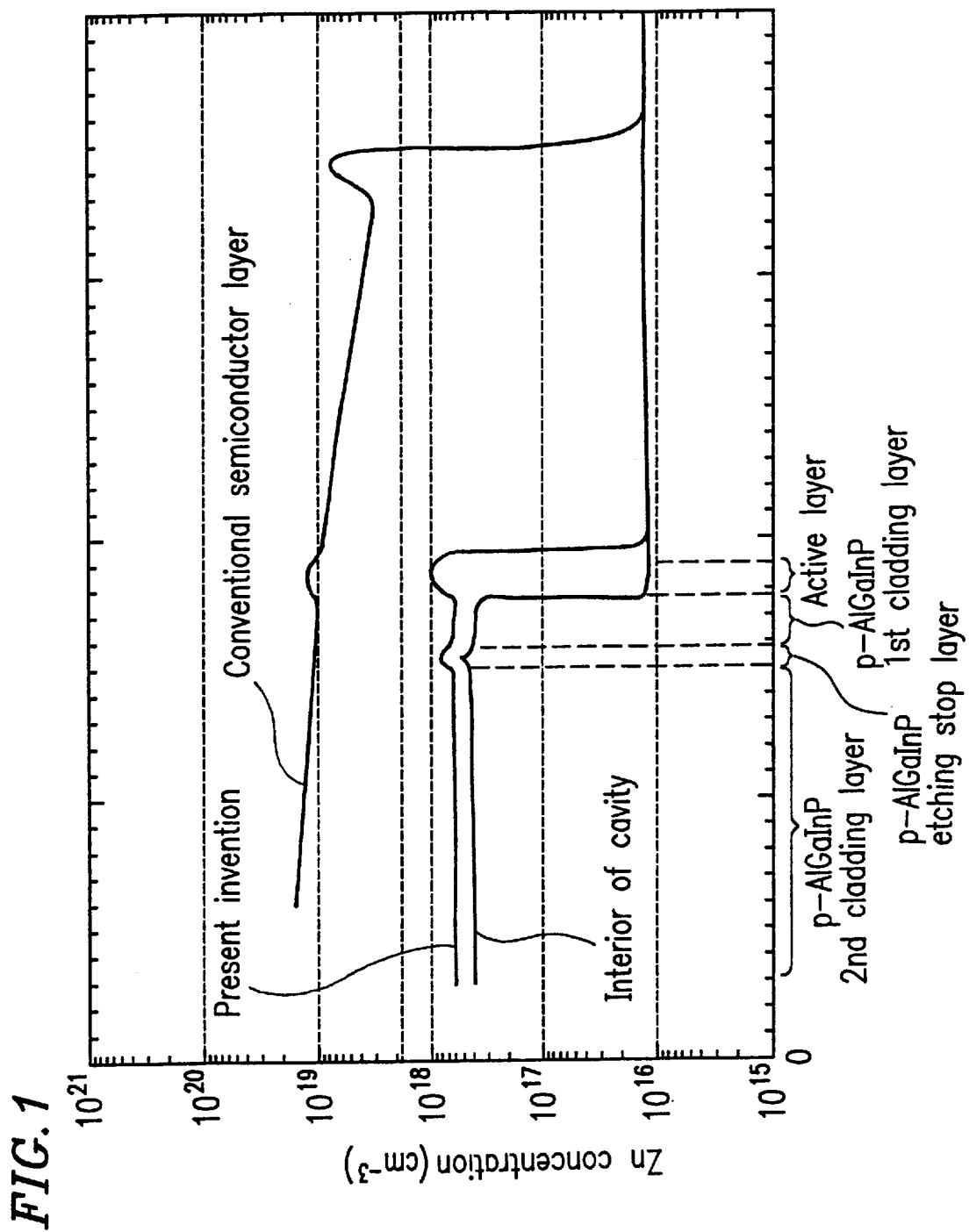
FIG. 1 is a diagram which illustrates Zn concentration in various layers of a window structure semiconductor laser device according to the present invention and a conventional window structure semiconductor laser device.

FIG. 1 is a diagram which illustrates Zn concentration in various layers of the semiconductor laser device according to the present invention and a conventional window structure semiconductor laser device. It will be seen from FIG. 1 that the Zn concentration in the p-GaInP etching stop layer 205 is about $2\times10^{18}$ cm$^{-3}$ or less. In this case, the etching stop layer 205 is prevented from entering the state of being an undesirably high degree of mixed crystal.

As seen from the results according to the present invention shown in FIG. 1, the diffusion concentration of the impurity (i.e., Zn in this example) is about $2\times10^{18}$ cm$^{-3}$ or less not only in the p-GaInP etching stop layer 205 but also in the AlGaInP/GaInP super-lattice active layer 203, the p-AlGaInP first cladding layer 204, and the p-AlGaInP second cladding layer 206. The impurity (Zn) diffusion concentration is even lower in the layers located between the active layer 203 and the substrate 201 (e.g., the portion corresponding to the n-AlGaInP cladding layer 202).

It should also be noted that the aforementioned value of $2\times10^{18}$ cm$^{-3}$ is higher than the impurity concentration in regions outside the impurity diffusion regions 211, i.e., the interior of the cavity of the semiconductor laser device, (also shown in FIG. 1).

The p-GaAs impurity supply control layer 208 preferably has a thickness of about 100 Å or more. If the p-GaAs impurity supply control layer 208 is less than about 100 Å thick, it is difficult to controllably stop the high-concentration Zn diffusion front in the p-GaAs impurity supply control layer 208.

Figure 2C:
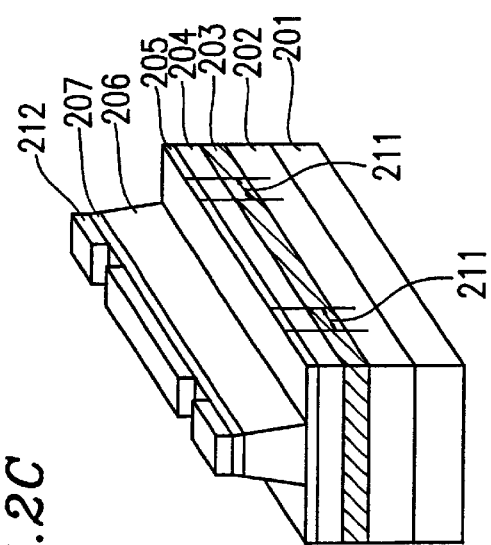

Referring to FIG. 2C, the SiN film 210 and the ZnO film 209 are removed by using an appropriate etchant, e.g., a hydrofluoric acid. Furthermore, by using a mixed solution of sulfuric acid and hydrogen peroxide, the p-GaAs impurity supply control layer 208 is etched away. Thereafter, by using a known technique, a stripe pattern of SiO$_2$ film 212 is formed on the exposed p-GaInP band graded layer 207 so as to extend along a plane which is perpendicular to the longitudinal direction of the impurity diffusion regions 211. By using the stripe pattern of SiO$_2$ film 212 as a mask, the p-GaInP band graded layer 207 is etched into a ridge shape by using an acetic acid-type etchant. Then, using a sulfuric acid-type etchant, the p-AlGaInP second cladding layer 206 is etched away until reaching the p-GaInP etching stop layer 205. As a result, a ridge structure composed of the p-GaInP band graded layer 207 and the p-AlGaInP second cladding layer 206 is formed as shown in FIG. 2C.

Since the sulfuric acid-type etchant has a greater etching selection rate for the p-AlGaInP second cladding layer 206 than for the p-GaInP etching stop layer 205 in regions other than the stripe-like impurity diffusion regions 211 (which correspond to the interior of the cavity of a completed semiconductor laser), the etching process can be successfully stopped at the etching stop layer 205. On the other hand, in the stripe-like impurity diffusion regions 211 (which correspond to the window structures of a completed semiconductor laser), Al is diffused into the GaInP because the GaInP and the AlGaInP have formed a mixed crystal. Therefore, the portions of the etching stop layer 205 which lie in the stripe-like impurity diffusion regions 211 have a higher etching rate than that for portions other than the stripe-like impurity diffusion regions 211.

However, the degree of mutual diffusion depends on the amount of Zn which is implanted through diffusion. By reducing the Zn concentration in the etching stop layer 205 within the stripe-like impurity diffusion regions 211 using the aforementioned method according to the present invention to about $2\times10^{18}$ cm$^{-3}$ or less, it is possible to retain a high etching selection ratio for the p-AlGaInP second cladding layer 206.

Thus, according to the present invention, the etching for forming the ridge structure is successfully stopped by the etching stop layer 205 within the impurity diffusion regions 211 as well as in regions outside the impurity diffusion regions 211 (which correspond to the interior of the cavity of a completed semiconductor laser). As a result, the shape and height of the resultant ridge are well controlled.

Figure 4:
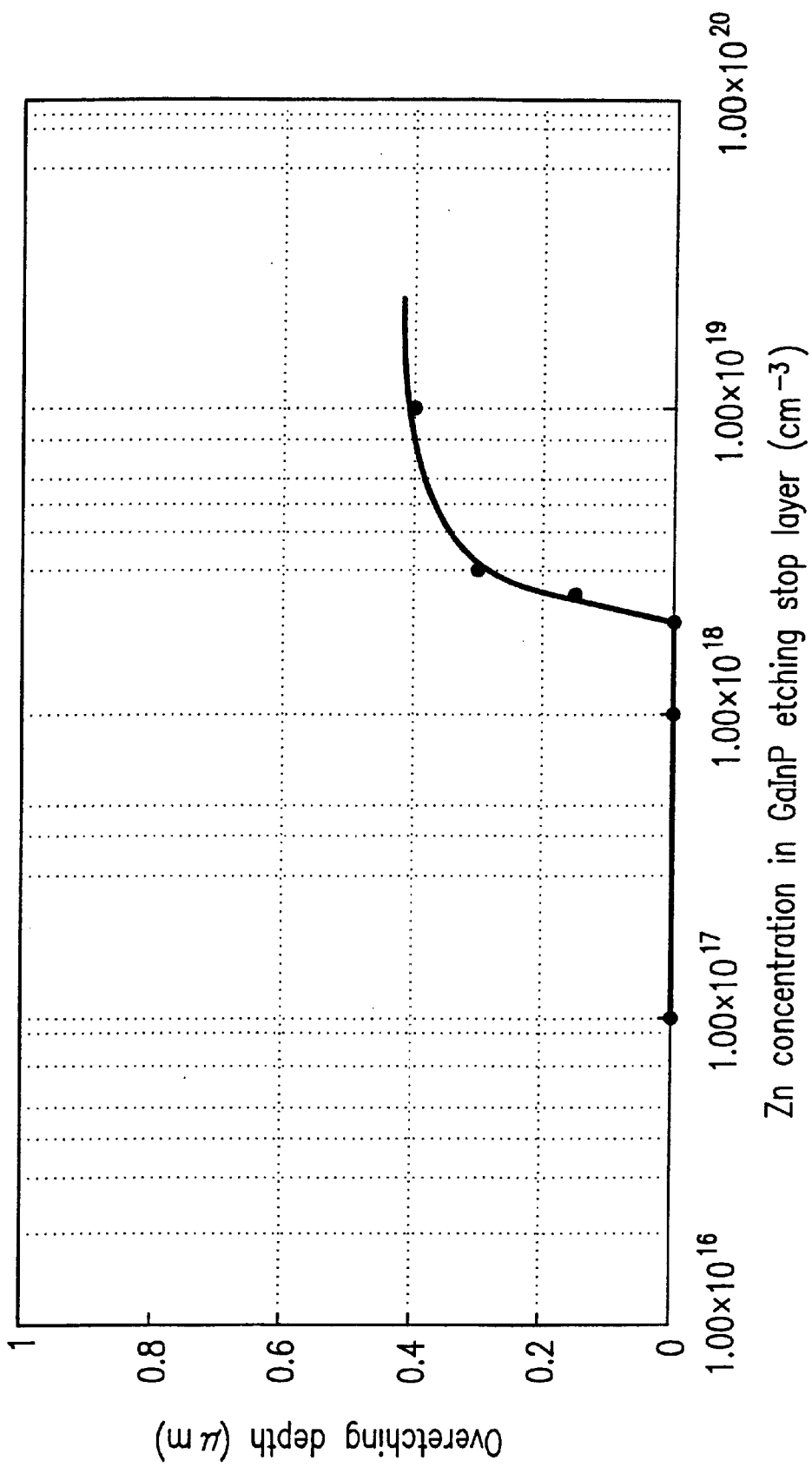
FIG. 4 is a graph illustrating the relationship between the concentration of Zn which is diffused within a GaInP etching stop layer and overetching depth according to a step in the manufacturing process of the present invention.

FIG. 4 is a graph illustrating the relationship between the concentration of Zn which is diffused within the GaInP etching stop layer 205 and overetching depth in the case where the GaInP etching stop layer 205 fails to stop the etching so that the etching proceeds toward the substrate 201.

As seen from FIG. 4, the overetching depth increases as the Zn concentration in the GaInP etching stop layer 205 increases. In other words, as the Zn concentration in the GaInP etching stop layer 205 increases, the etching selection ratio between the second cladding layer 206 and the etching stop layer 205 decreases due to the formation of a mixed crystal in the second cladding layer 206 and the etching stop layer 205, so that the etching cannot be properly stopped by the etching stop layer 205. In contrast, by ensuring that the Zn concentration within the impurity diffusion regions 211 of the etching stop layer 205 are about $2 \times 10^{18}$ cm$^{-3}$ or less according to the present invention, it becomes possible to prevent the overetching from occurring within the impurity diffusion regions 211.

Referring back to FIG. 2C, portions of the SiO$_2$ film 212 which correspond to the impurity diffusion regions 211 are removed by photolithography and etching techniques so as to leave openings therein.

Then, as shown in FIG. 2D, an n-type current blocking layer 213 is grown so as to bury the ridge structure by a selective growth technique using an MOVPE method. After removing the SiO$_2$ film 212 serving as a mask, a p-GaAs contact layer 214 is grown on the n-type current blocking layer 213. By using a known technique, p-side and n-side ohmic electrodes are formed (not shown).

The resultant semiconductor multilayer structure is cleaved in the impurity diffusion regions 211 along a plane perpendicular to the longitudinal direction of the ridge structure, thereby forming laser cavity end faces. As a result, a semiconductor laser device having window structures as shown in FIG. 2D is accomplished.

Figure 5:
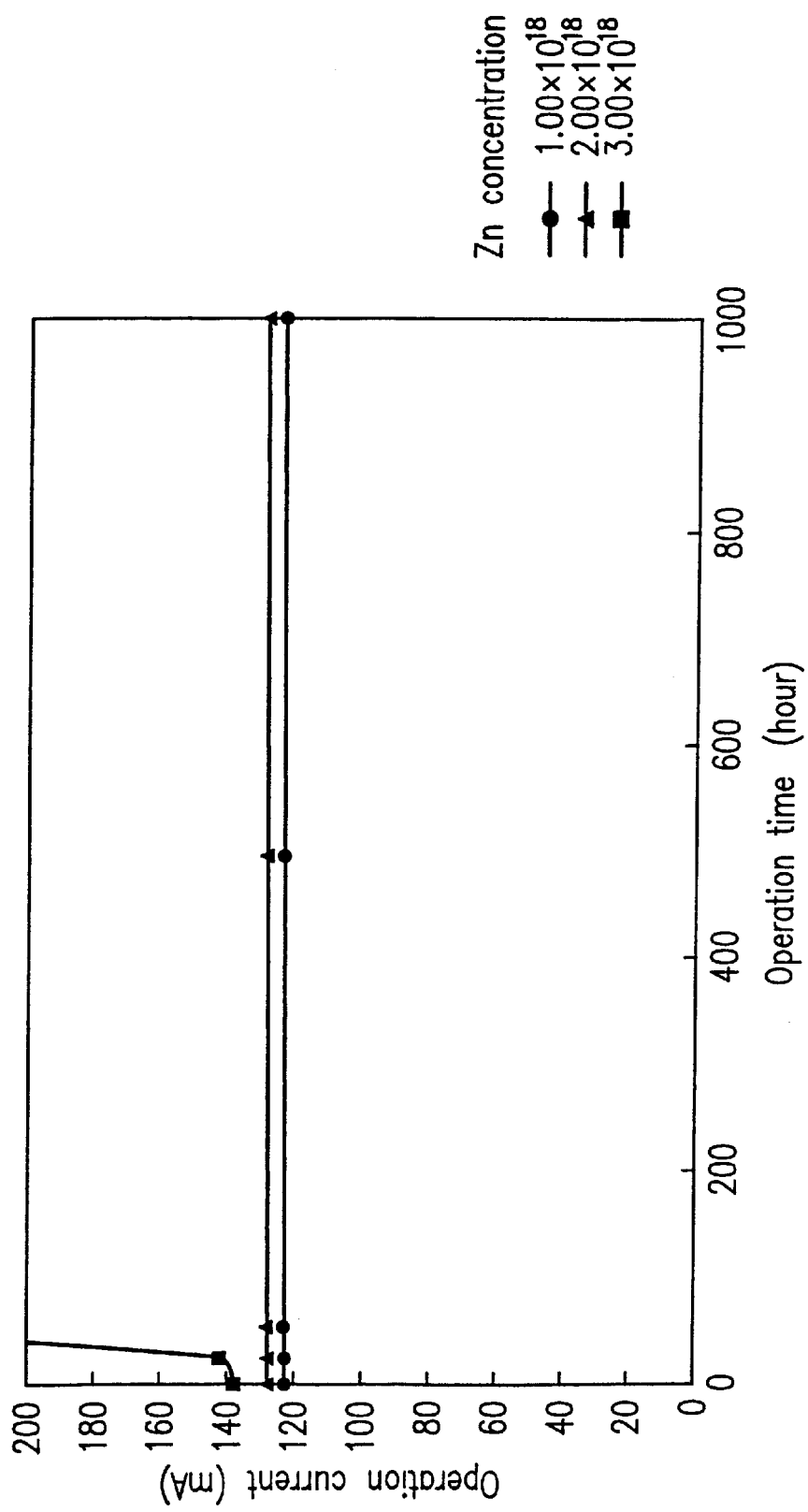
FIG. 5 is a graph illustrating results of a reliability test with respect to a plurality of semiconductor laser samples having different concentration levels of Zn which is diffused within the GaInP etching stop layer.
Figure 6A:
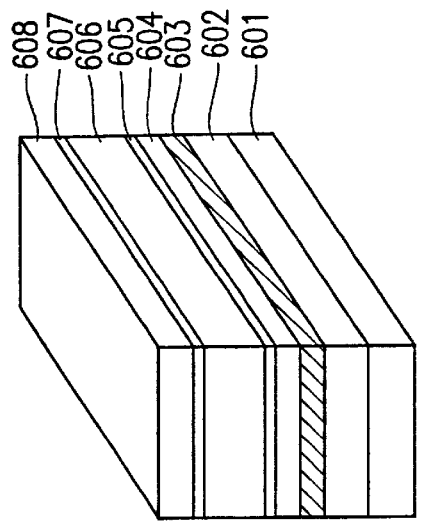
FIGS. 6A to 6D are diagrams illustrating respective steps of a manufacturing process for a conventional window structure semiconductor laser device.
Figure 6B:
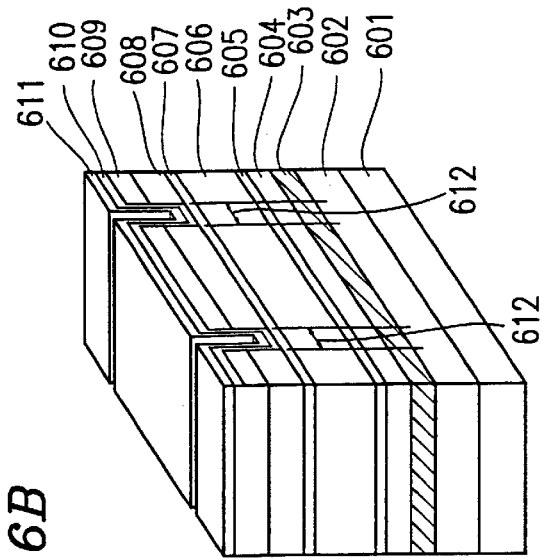
Figure 6C:
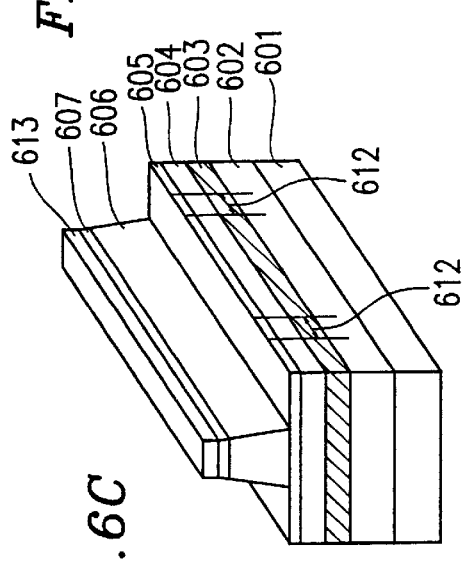
Figure 6D:
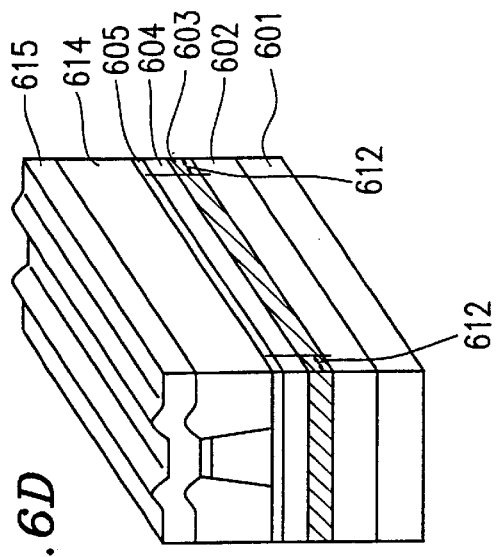

In order to study the effects of the present invention, a plurality of sample semiconductor laser devices having different levels of Zn concentration diffused in the GaInP etching stop layer 205 were produced, and reliability tests were performed for the samples. The results are shown in FIG. 5. The reliability tests were performed under the following conditions: the operation temperature was 60° C.; the output power was 35 mW; and the oscillation wavelength was 659 nm.

As seen from FIG. 5, overetching occurs in a semiconductor laser sample whose Zn concentration in the GaInP etching stop layer 205 is $3 \times 10^{18}$ cm$^{-3}$ for the aforementioned reason, and the propagation loss within the current blocking layer 213 increases. As a result, rapid degradation (i.e., increase in the operation current) occurs under high power operation conditions due to light absorption in the vicinity of the cavity end faces. Thus, such a semiconductor laser cannot attain sufficient reliability. On the other hand, in a semiconductor laser sample according to the present invention, in which the Zn concentration in the GaInP etching stop layer 205 is controlled to about $2 \times 10^{18}$ cm$^{-3}$ or less, the ridge in the vicinity of end faces is adequately formed. Thus, the semiconductor laser according to the present invention exhibits excellent reliability characteristics with a stable operation current over long periods of time, so that a practicable high power laser is realized according to the present invention.

According to the present invention, the laser outgoing end face of the completed semiconductor laser is disordered due to Zn diffusion. As a result, the active layer 203 in the disordered region near the laser outgoing end face has a band gap which is greater than the band gap of non-disordered regions of the active layer 203. Thus, the disordered regions of the active layer 203 define window structures. Since the concentration of Zn which is diffused in the window structures is controlled at a low level, the etching stop layer 205 is prevented from being destroyed, so that overetching is minimized. As a result, the ridge of the semiconductor laser device according to the present invention can be formed with good controllability.

Since the ridge of the semiconductor laser device according to the present invention is formed with good controllability, the propagation loss by the current blocking layer 213 can be prevented. Thus, a high-power semiconductor laser can be realized based on the prevention of propagation losses in the vicinity of cavity end faces.

According to the present invention, the concentration of Zn which is implanted into portions of the respective layers of the semiconductor multilayer structure which are within the stripe-like impurity diffusion regions 211 is controlled to a low level (i.e., about $2 \times 10^{18}$ cm$^{-3}$ or less). In particular, the propagation loss due to carrier scattering in the active layer 203 can be minimized.

Although the impurity supply control layer 208 is illustrated as being composed of GaAs in the above example, the present invention is also applicable to the case where the impurity supply control layer 208 is composed of another material types having a lower diffusion speed than that of an AlGaInP group material. In such cases as well, the same effects as those provided by the aforementioned GaAs impurity supply control layer 208 can be achieved.

Compound semiconductor materials whose main components are GaP can be used as materials for constructing the respective layers of the semiconductor multilayer structure.

Although the above example illustrates the case where the diffused impurity is Zn, the present invention is also applicable to any other impurity, e.g., Si. In such cases as well, the same effects as those provided by the Zn impurity can be achieved.

The results obtained according to the present invention, shown in FIG. 1, indicate that there is a diffusion concentration gradient of impurity (e.g., Zn) which is equal to or smaller than about $2 \times 10^{18}$ cm$^{-3}$ per μm along the vertical direction (for conciseness, such a diffusion concentration gradient will be referred to as "$2 \times 10^{18}$ cm$^{-3}$ μm$^{-1}$ or less") in the AlGaInP/GaInP super-lattice active layer 203, the p-AlGaInP first cladding layer 204, the p-GaInP etching stop layer 205, and the p-AlGaInP second cladding layer 206. Specifically, the diffusion concentration gradient of impurity is taken along a direction which is perpendicular to the surface of the substrate 201 (hereinafter referred to as the "normal direction to the substrate), from the upper face toward the bottom face of the substrate 201.

According to the present invention, the GaAs impurity supply control layer 208 is effectively employed in conjunction with the disordering process for the active layer 203. As a result, the concentration of an impurity (e.g., Zn) which is implanted into predetermined regions (i.e., impurity diffusion regions) of the respective layers of the semiconductor multilayer structure can be controlled to a low level. Thus, a wet etching performed for forming a ridge of the semiconductor laser device can be successfully stopped by the etching stop layer, whereby the shape and height of the ridge can be accurately controlled.

Since the ridge of the semiconductor laser device according to the present invention can be formed with good controllability, it is possible to control the expanse of light exiting the laser device. Since the current blocking layer 213 is prevented from being formed in the close vicinity of the active layer 203 due to unwanted overetching, the propagation loss is prevented.

According to the present invention, the concentration of an impurity (e.g., Zn) which is implanted and diffused into the crystals of the respective layers of the semiconductor multilayer structure is controlled to a low level (i.e., about $2 \times 10^{18}$ cm$^{-3}$ or less) by the use of the GaAs impurity supply control layer 208 in conjunction with the disordering process for the active layer 203. Since the current blocking layer 213 is prevented from being formed in the close vicinity of the active layer 203 due to unwanted overetching, the propagation loss due to carrier scattering in the active layer 203, in particular, can be minimized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising:

a semiconductor substrate of a first conductivity type;

a cladding layer of the first conductivity type provided on the semiconductor substrate;

an active layer provided on the cladding layer of the first conductivity type, the active layer having a superlattice structure including a disordered region in a vicinity of at least one cavity end face;

a first cladding layer of a second conductivity type provided on the active layer;

an etching stop layer of the second conductivity type provided on the first cladding layer; and a second cladding layer of the second conductivity type provided on the etching stop layer, the second cladding layer forming a ridge structure, the ridge structure extending along a cavity length direction and having a predetermined width, wherein a concentration of an impurity in the etching stop layer in the vicinity of the at least one cavity end face is greater than a concentration of the impurity in the interior of a cavity and equal to or smaller than about $2 \times 10^{18}$ cm$^{-3}$, and the etching stop layer is a single layer.

2. A semiconductor laser device according to claim 1, wherein the semiconductor substrate comprises a compound semiconductor material containing GaAs of the first conductivity type as a main component;

the cladding layer of the first conductivity type comprises a compound semiconductor material containing GaP of the first conductivity type as a main component; and the active layer comprises a compound semiconductor material containing GaP as a main component, and the first cladding layer, the etching stop layer, and the second cladding layer each comprise a compound semiconductor material containing GaP of the second conductivity type as a main component.

3. A semiconductor laser device according to claim 2, wherein the impurity is Zn.

4. A semiconductor laser device according to claim 1, wherein the semiconductor substrate comprises GaAs of the first conductivity type;

the cladding layer of the first conductivity type comprises AlGaInP of the first conductivity type;

the active layer comprises AlGaInP and GaInP;

the first cladding layer comprises AlGaInP of the second conductivity type;

the etching stop layer comprises GaInP of the second conductivity type; and the second cladding layer comprises AlGaInP of the second conductivity type.

5. A semiconductor laser device according to claim 1, wherein a concentration gradient of an impurity in the second cladding layer in the vicinity of the at least one cavity end face, taken along a normal direction to the substrate from an upper face toward a bottom face of the substrate, is greater than a concentration gradient of the impurity in the interior of the cavity along the normal direction to the substrate, and is equal to or smaller than about $2 \times 10^{18}$ cm$^{-3}$ $\mu$m$^{-1}$.

6. A semiconductor laser device according to claim 1, wherein a concentration of an impurity in the active layer in the vicinity of the at least one cavity end face is greater than a concentration of the impurity in the interior of the cavity, and is equal to or smaller than about $2 \times 10^{18}$ cm$^{-3}$.

* * * * *